United States Patent
Tchakarov et al.

(10) Patent No.: US 8,593,055 B2
(45) Date of Patent: Nov. 26, 2013

(54) SUBSTRATE BEARING AN ELECTRODE, ORGANIC LIGHT-EMITTING DEVICE INCORPORATING IT, AND ITS MANUFACTURE

(75) Inventors: Svetoslav Tchakarov, Arcueil (FR); Sophie Besson, Compiègne (FR); Didier Jousse, Taverny (FR)

(73) Assignee: Saint-Gobain Glass France, Courbevoie (FR)

( * ) Notice: Subject to any disclaimer, the term of this patent is extended or adjusted under 35 U.S.C. 154(b) by 49 days.

(21) Appl. No.: 12/744,248

(22) PCT Filed: Nov. 21, 2008

(86) PCT No.: PCT/FR2008/052109
§ 371 (c)(1),
(2), (4) Date: Sep. 7, 2010

(87) PCT Pub. No.: WO2009/071822
PCT Pub. Date: Jun. 11, 2009

(65) Prior Publication Data
US 2011/0001420 A1    Jan. 6, 2011

(30) Foreign Application Priority Data
Nov. 22, 2007 (FR) ...................................... 07 59235

(51) Int. Cl.
*H01J 1/02* (2006.01)
*H01L 33/42* (2010.01)

(52) U.S. Cl.
USPC ........... 313/503; 313/498; 313/504; 313/506; 257/89; 257/98; 445/35; 445/24

(58) Field of Classification Search
USPC .................................. 313/500, 504, 506, 503
See application file for complete search history.

(56) References Cited

U.S. PATENT DOCUMENTS

| 4,649,432 A | 3/1987 | Watanabe et al. |
| 5,280,373 A | 1/1994 | Ozawa et al. |

(Continued)

FOREIGN PATENT DOCUMENTS

| DE | 197 33 053 | 2/1999 |
| DE | 20 2005 000 979 | 7/2006 |

(Continued)

OTHER PUBLICATIONS

International Search Report as issued for PCT/FR2008/052109, dated Jul. 8, 2009.

(Continued)

*Primary Examiner* — Sikha Roy
(74) *Attorney, Agent, or Firm* — Pillsbury Winthrop Shaw Pittman LLP

(57) ABSTRACT

A substrate bearing, on one main face, a composite electrode, which includes an electroconductive network formed from strands made of an electroconductive material based on a metal and/or a metal oxide, and having a light transmission of at least 60% at 550 nm, the space between the strands of the network being filled by a material referred to as an insulating fill material. The composite electrode also includes an electroconductive coating covering the electroconductive network, and in electrical connection with the strands and in contact therewith, having a thickness greater than or equal to 40 nm, of resistivity ρ1 less than $10^5$ Ω·cm and greater than the resistivity of the network, the coating forming a smoothed outer surface of the electrode. The composite electrode additionally has a sheet resistance less than or equal to 10Ω/□.

40 Claims, 2 Drawing Sheets

(56) References Cited

U.S. PATENT DOCUMENTS

| | | | |
|---|---|---|---|
| 5,346,770 | A | 9/1994 | Osada et al. |
| 5,667,853 | A | 9/1997 | Fukuyoshi et al. |
| 5,962,115 | A | 10/1999 | Zmelty et al. |
| 6,014,196 | A | 1/2000 | Anzaki et al. |
| 6,040,056 | A | 3/2000 | Anzaki et al. |
| 6,045,896 | A | 4/2000 | Boire et al. |
| 6,157,127 | A * | 12/2000 | Hosokawa et al. ........... 313/506 |
| 6,414,431 | B1 | 7/2002 | Yu et al. |
| 6,489,045 | B1 | 12/2002 | Araki et al. |
| 6,645,645 | B1 | 11/2003 | Adachi et al. ................ 428/690 |
| 7,049,757 | B2 | 5/2006 | Foust et al. |
| 7,161,171 | B2 * | 1/2007 | Dahmani et al. ............... 257/40 |
| 7,172,822 | B2 | 2/2007 | Shibata ........................ 428/690 |
| 2001/0010566 | A1 * | 8/2001 | Izumi et al. ..................... 349/43 |
| 2002/0008286 | A1 | 1/2002 | Yamazaki et al. |
| 2002/0110703 | A1 * | 8/2002 | Tada et al. .................... 428/690 |
| 2003/0049464 | A1 | 3/2003 | Glenn et al. |
| 2003/0162333 | A1 | 8/2003 | Kim et al. |
| 2003/0186064 | A1 | 10/2003 | Murata et al. |
| 2004/0001915 | A1 | 1/2004 | He et al. |
| 2004/0031957 | A1 | 2/2004 | Tyan |
| 2004/0032220 | A1 | 2/2004 | Cok et al. |
| 2004/0081855 | A1 | 4/2004 | Kim et al. |
| 2004/0113146 | A1 | 6/2004 | Dahmani et al. |
| 2004/0149984 | A1 | 8/2004 | Tyan et al. |
| 2004/0150326 | A1 | 8/2004 | Shibata ........................ 313/503 |
| 2004/0245918 | A1 | 12/2004 | Lee |
| 2004/0253439 | A1 | 12/2004 | Martin et al. ................. 428/339 |
| 2005/0000564 | A1 | 1/2005 | Sato et al. |
| 2005/0073228 | A1 | 4/2005 | Tyan et al. |
| 2005/0073251 | A1 | 4/2005 | Kato |
| 2005/0124257 | A1 | 6/2005 | Maeuser |
| 2005/0162071 | A1 | 7/2005 | Lee et al. |
| 2005/0170211 | A1 * | 8/2005 | Fujioka ........................ 428/690 |
| 2005/0199904 | A1 | 9/2005 | Yamamoto |
| 2005/0264185 | A1 | 12/2005 | Hoffmann |
| 2006/0043886 | A1 | 3/2006 | Lee et al. |
| 2006/0046096 | A1 * | 3/2006 | Nomura et al. ............... 428/690 |
| 2006/0091791 | A1 | 5/2006 | Shin |
| 2006/0099441 | A1 * | 5/2006 | Teyssedre et al. ............ 428/633 |
| 2006/0124933 | A1 | 6/2006 | Kang |
| 2006/0152833 | A1 | 7/2006 | Halls et al. |
| 2006/0209551 | A1 | 9/2006 | Schwenke et al. |
| 2006/0269786 | A1 | 11/2006 | Shin et al. |
| 2006/0290841 | A1 | 12/2006 | Kwon et al. |
| 2007/0206263 | A1 | 9/2007 | Neuman et al. |
| 2007/0257608 | A1 | 11/2007 | Tyan et al. .................... 313/506 |
| 2008/0100202 | A1 | 5/2008 | Cok |
| 2009/0166877 | A1 * | 7/2009 | Lifka et al. ................... 257/773 |
| 2010/0072884 | A1 | 3/2010 | Tchakarov et al. |
| 2010/0117523 | A1 | 5/2010 | Tchakarov |
| 2010/0225227 | A1 | 9/2010 | Tchakarov et al. |
| 2011/0273085 | A1 * | 11/2011 | Garbar et al. ................. 313/509 |

FOREIGN PATENT DOCUMENTS

| | | |
|---|---|---|
| EP | 0 733 931 | 9/1996 |
| EP | 0 747 330 | 12/1996 |
| EP | 0 847 965 | 6/1998 |
| EP | 0 888 035 A | 12/1998 |
| EP | 1 329 307 | 7/2003 |
| EP | 1 396 676 | 3/2004 |
| EP | 1 403 939 | 3/2004 |
| EP | 1 521 305 | 4/2005 |
| EP | 1 693 483 | 8/2006 |
| EP | 1 717 876 | 11/2006 |
| FR | 2 844 136 | 3/2004 |
| JP | 10-100303 | 4/1998 |
| JP | 10-217378 | 8/1998 |
| JP | 11-070610 | 3/1999 |
| JP | 2001-243840 | 9/2001 |
| JP | 2002-015623 | 1/2002 |
| JP | 2002-313139 | 10/2002 |
| JP | 2002-313572 | 10/2002 |
| JP | 2004-228057 | 8/2004 |
| JP | 2007-287419 | 11/2007 |
| WO | WO 99/02017 | 1/1999 |
| WO | WO 2004/025334 | 3/2004 |
| WO | WO 2004/057674 | 7/2004 |
| WO | WO 2005/008800 | 1/2005 |
| WO | WO 2005/041620 | 5/2005 |
| WO | WO 2005/053053 | 6/2005 |
| WO | WO 2006/013373 | 2/2006 |
| WO | WO 2007/096565 | 8/2007 |
| WO | WO 2007/119200 | 10/2007 |
| WO | WO 2008/129199 | 10/2008 |
| WO | WO 2009/071821 | 6/2009 |

OTHER PUBLICATIONS

Toki et al., "Sol-Gel Formation of ITO Thin Film From a Sol Including ITO Powder," Journal of Sol-Gel Science and Technology, vol. 8, No. 1/02/03, 1997, pp. 717-720.

Daoudi, Kaïs, Thesis titled "Élaboration et Caracterisation de Films Minces D'Oxyde D'Indium Dope a l'Etain Obtenus par Voie Sol-Gel", order No. 58-2003, presented on May 20, 2003 before Université Claude Bernard Lyon 1 in Lyon, France.

Kloeppel, A., et al., "Dependence of the electrical and optical behaviour of ITO-silver-ITO multilayers on the silver properties", Thin Solid Films, Elsevier, vol. 365, No. 1, pp. 139-146, Apr. 1, 2000.

Jung, Yeon Sik, et al., "Effects of thermal treatment on the electrical and optical properties of silver-based indium tin oxide / metal / indium tin oxide structures", Thin Solid Films, Elsevier, vol. 440, No. 1-2, pp. 278-284, Sep. 1, 2003.

Notice of Reasons for Rejection as issued for Japanese Patent Application No. 2010-534529, dated Jan. 8, 2013.

* cited by examiner

SUBSTRATE BEARING AN ELECTRODE, ORGANIC LIGHT-EMITTING DEVICE INCORPORATING IT, AND ITS MANUFACTURE

CROSS-REFERENCE TO RELATED APPLICATIONS

This application is the U.S. National Stage of PCT/FR2008/052109, filed Nov. 21, 2008, which in turn claims priority to French Application No. 0759235, filed Nov. 22, 2007. The content of both applications are incorporated herein by reference in their entirety.

The subject of the present invention is a substrate bearing an electrode, the organic light-emitting device incorporating it, and its manufacture.

Known organic light-emitting systems or OLEDs (organic light-emitting devices) comprise an organic electroluminescent material or a stack of such materials supplied with electricity by electrodes flanking it in the form of electroconductive layers.

Conventionally, the upper electrode is a reflective metal layer, for example made of aluminium, and the lower electrode is a transparent layer based on indium oxide, generally tin-doped indium oxide better known by the abbreviation ITO, with a thickness of around 100 to 150 nm. However, for uniform illumination over large areas, it is necessary to form a discontinuous lower electrode, typically by forming electrode zones of a few $mm^2$, and to drastically reduce the distance between each electrode zone, typically by around ten microns. Use is made of expensive and complex photolithography and passivation techniques.

Document U.S. Pat. No. 7,172,822 furthermore propose an OLED device, of which the electrode nearest to the substrate comprises an irregular network conductor obtained by filling a cracked mask. More specifically, between the glass substrate and the OLED active layer, the OLED device successively comprises:
- a gold-based sublayer;
- a sol-gel layer, that forms the microcracked mask after annealing, having a thickness equal to 0.4 μm;
- the gold-based network conductor, obtained by catalytic deposition, this network conductor having a sheet resistance equal to 3Ω/□, and a light transmission of 83%;
- a 50 nm poly(3,4-ethylenedioxythiophene) layer.

FIG. 3 from this document U.S. Pat. No. 7,172,822 reveals the morphology of the silica sol-gel mask. It appears in the form of fine crack lines oriented along a preferred direction, with bifurcations characteristic of the fracture phenomenon of an elastic material. These main crack lines are occasionally joined together by the bifurcations.

The domains between the crack lines are asymmetric with two characteristic dimensions: one parallel to the crack propagation direction between 0.8 and 1 mm, the other perpendicular between 100 and 200 μm.

This electrode has acceptable electroconductive and transparency properties, the sheet resistance being equal to 3Ω/□ and the light transmission of 82%. However, the reliability of the OLED device with such an electrode is not ensured. Moreover, the fabrication of the electrode may be further improved.

To form the cracked sol-gel mask, a sol based on water, alcohol and a silica precursor (TEOS) was deposited, the solvent was evaporated and it was annealed at 120° C. for 30 minutes.

This process for manufacturing an electrode by cracking of the sol-gel mask constitutes progress for the manufacture of a network conductor by eliminating, for example, recourse to photolithography (exposure of a resin to radiation/a beam and development), but may still be improved, especially in order to be compatible with industrial requirements (reliability, simplification and/or reduction of the manufacturing steps, reduced cost, etc.).

It can also be observed that the process for manufacturing the network inevitably requires the deposition of a (chemically or physically) modifiable sublayer at the openings in order to either allow a favored adhesion (of metal colloids, for example) or else to allow catalyst grafting for metal post-growth, this sublayer therefore having a functional role in the growth process of the network.

Furthermore, the profile of the cracks is V-shaped due to the fracture mechanics of the elastic material, which involves the use of a post-mask process in order to make the metallic network grow starting from colloidal particles located at the base of the V.

The objective of the invention is to obtain an electrode for an OLED of high performances (high conductivity, suitable transparency) which is reliable, robust, reproducible, that can be produced over large areas, all this on an industrial scale and preferably at a lower cost and as easily as possible. Preferably, this electrode also contributes to the increase in the overall performances of the OLED device (light output, uniformity of illumination, etc.).

For this purpose, a first subject of the present invention is a substrate bearing, on one main face, a composite electrode, which comprises:
- an electroconductive network formed from strands which is a layer (single layer or multilayer) made of an electroconductive material(s) based on a metal and/or a metal oxide, the network having a light transmission of at least 60% at 550 nm, or even an integrated light transmission of at least 60%, the space between the strands of the network being filled by a material referred to as an electrically insulating fill material;
- an electroconductive coating (entirely) covering the electroconductive network, having a thickness greater than or equal to 40 nm, in electrical connection with the strands and in contact with the strands, of resistivity ρ1 less than $10^5$ Ω·cm and greater than the resistivity of the material that forms the strands of the network, the coating forming a smoothed outer surface of the electrode;
- the composite electrode also having a sheet resistance less than or equal to 10Ω/□.

The composite electrode according to the invention thus comprises an electroconductive network that is buried, the surface of which is smoothed to avoid introducing electrical defects into the OLEDs.

Depending on its thickness (less than or equal to the thickness of the strands), the fill material significantly reduces, even eliminates, the difference between the top level and the bottom level of the electrode network.

Through the electroconductive coating, the risks of short circuits generated by spike effects resulting from an uncontrolled surface microroughness of the strands and/or of the surface of the fill material between the strands are eliminated.

Through the sufficiently smooth fill material, or fill material of controlled roughness, it is thus possible to contribute to the elimination of the risks of short circuits generated by spike effects.

The electroconductive coating according to the invention thus makes it possible either to smooth the network and the fill material or at the very least maintain a smoothing obtained beforehand (for example by polishing).

On the contrary, the network conductor described in document U.S. Pat. No. 7,172,822 is covered with a thin polymer layer which matches the difference in height between the network conductor and the cracked mask.

Through this design of a buried and smoothed network electrode according to the invention, the reliability and reproducibility of the OLED are thus guaranteed, and its service life is thus prolonged.

The invention thus relates, starting from an electrode made of a network of strands which may be relatively thick and/or spaced out, to controlling the roughness of the electrode on several levels (firstly by burying the network in order to suppress abrupt steps and then by smoothing it sufficiently) and to ensure electrical and transparency properties that are suitable for an electrode made of several materials (strand material(s), fill material, electroconductive coating material) or even to improve the performances of the OLED.

The insulating fill material may be single-component or multicomponent, single-layer or multilayer. It may preferably be different from a simple passivation resin.

The fill material may advantageously preferably have at least one of the following functions:
- be a mask with a network of openings in order to form the electroconductive network;
- have a role of smoothing the surface of the electrode, in particular by choosing a surfacable or smooth material (via a judicious choice of the deposition method, of its formulation, of its thickness);
- be a means of extracting the radiation emitted by the OLED.

The electroconductive coating according to the invention, due to its resistivity, its covering of the network and its thickness, contributes to a better distribution of the current.

The resistivity of the electroconductive coating $\rho 1$ may be less than or equal to $10^3$ $\Omega \cdot cm$, and even less than or equal to $10^2$ $\Omega \cdot cm$.

The network may be in the form of lines, for example parallel lines, or else in the form of closed patterns (strands interconnected to one another, defining meshes), for example geometrical (rectangular, square, polygonal, etc.) closed patterns and optionally patterns of irregular shape and/or of irregular size.

It is possible to define B as the average distance between the strands (in particular corresponding to an average mesh size), A as the average width of the strands, and B+A as the average period of the optionally irregular network.

The shorter the average distance B between strands (dense network), the higher the resistivity of the electroconductive coating may be. The fill material is insulating. The resistivity $\rho 1$ may preferably be less than or equal to $10^{-1}$ $\Omega \cdot cm$ in particular when the network is dense (B typically less than or equal to 50 $\Omega m$). When the network is not very dense (B typically greater than 50 $\Omega m$), the resistivity $\rho 1$ may then more preferably still be less than or equal to $10^{-2}$ $\Omega \cdot cm$, or even less than or equal to $10^{-4}$ $\Omega \cdot cm$.

The resistivity $\rho 1$ may possible be at least ten times greater than $\rho 2$ to reduce the sensitivity to short circuits.

The surface of the electroconductive coating is the outer surface of the electrode. The surface of the electroconductive coating may be intended preferably to be in contact with the organic layers of the OLED: in particular the hole injection layer (HIL) and/or the hole transport layer (HTL).

The surface of the electrode according to the invention is not necessarily planar, planarized by the coating. It may be rippled.

Specifically, the electroconductive coating may smooth the surface firstly by forming undulations that are sufficiently spread out. It is thus important to eliminate sharp angles, steep gaps. Preferably, the outer surface is such that, starting from an the actual profile of the outer surface over the average period of the network B+A and by forming a corrected profile by nanoscale filtering to eliminate the local microroughness, an angle formed by the tangent to the corrected profile with the average plane of the corrected (or actual) profile is obtained that is less than or equal to 45°, more preferably still than or equal to 30°, at any point of the corrected profile.

For these angle measurements it is possible to use an atomic force microscope. An image of the actual surface is formed over a squared period $(A+B)^2$ of the network. This image or a section of this image thus forming the actual profile of the surface along a given axis is exploited. The analysis length A+B for the profile is judicious since it clearly reflects the profile of the roughness. The average period of the network B+A is typically submillimetric, preferably between 10 μm and 500 μm.

The actual profile is corrected by taking (at any point) a moving average on the scale between 50 and 200 nm, for example 100 nm, and then, for each point, the angle between the mid-plane and the tangent to the profile is determined. This nanoscale filtering thus serves firstly to dismiss the irregularities on a short scale.

It is not however sufficient to soften the surface without limiting the local microroughnesses in order to prevent short circuits as much as possible.

Thus, the residual profile is used, that is to say the actual profile minus the corrected profile. The residual profile may thus have a maximum altitude difference between the highest point and the lowest point ("peak to valley" parameter) less than 50 nm, more preferably still less than or equal to 20 nm, or even 10 nm, over the average period of the network B+A.

The residual profile may also have an RMS roughness parameter less than or equal to 50 nm, even 20 nm (otherwise known as Rq), or even 5 nm over the average period of the network B+A.

RMS stands for "Root Mean Square" roughness. It is a measurement that consists in measuring the value of the root mean square deviation of the roughness. The RMS parameter, in concrete terms, therefore quantifies on average the height of the peaks and valleys of residual roughness (local microroughness), compared to the average (residual) height. Thus, an RMS of 10 nm signifies a double peak amplitude.

Naturally, the limit conditions on the angles and the residual microroughness may preferably be satisfied over the majority of the electrode surface. To verify this, it is possible to take the measurements over various zones spread (uniformly) over the entire surface.

It is preferred to take these measurements in the active zones of the electrode, certain zones, such as for example the edges of the electrode, possibly being passivated for example for the connection system or to form several luminous zones.

The angle measurements may also be taken in other manner by a mechanical stylus system (using, for example, the measurement instruments sold by VEECO under the name DEKTAK).

The outer surface of the electroconductive coating may also have very large scale undulations, typically over one or more millimetres. Furthermore, the substrate, and consequently the outer surface, may be curved.

The light transmission of the network depends on the ratio B/A of the average distance between the strands B to the average width of the strands A.

Preferably, the ratio B/A is between 5 and 15, more preferably still around 10, to easily retain the transparency and facilitate the fabrication. For example, B and A are respectively equal to around 300 µm and 30 µm, 100 µm and 10 µm, 50 µm and 5 µm, or 20 µm and 2 µm.

In particular, an average width of strands A less than 30 µm, typically between 100 nm and 30 µm, preferably less than or equal to 10 µm, or even 5 µm to limit their visibility and greater than or equal to 1 µm to facilitate the fabrication and to easily retain high conductivity and transparency. The preferred range is between 1 and 10 µm.

In particular, it is also possible to choose an average distance between strands B that is greater than A, between 5 µm and 300 µm, even between 20 and 100 µm, to easily retain the transparency.

Since the network may be irregular and/or the edges of the strands may be sloping, the dimensions A and B are therefore average dimensions.

The average thickness of the strands may be between 100 nm and 5 µm, more preferably still from 0.5 to 3 µm, or even between 0.5 and 1.5 µm to easily retain transparency and high conductivity.

Advantageously, the composite electrode according to the invention may have:
- a sheet resistance less than or equal to 5Ω/□, even less than or equal to 1Ω/□, or even 0.5Ω/□ in particular for a network thickness (even a total electrode thickness) greater than or equal to 1 µm, and preferably less than 10 µm, even less than or equal to 5 µm;
- and/or a light transmission $T_L$ greater than or equal to 50%, more preferably still greater than or equal to 70%.

The composite electrode according to the invention may be used for a bottom emission organic light-emitting device or for a bottom and top emission organic light-emitting device.

The light transmission $T_L$ may be, for example, measured on a substrate having a $T_L$ of around 90% or even higher, for example a soda-lime-silica glass.

The composite electrode according to the invention may be over a large area, for example an area greater than or equal to 0.02 $m^2$ or even greater than or equal to 0.5 $m^2$ or 1 $m^2$.

Furthermore, a deposition, even a thick deposition, of an electroconductive material may cover the strands without sufficiently smoothing the surface. This is because chemical (CVD) or physical (PVD) gas phase deposition techniques, in particular the depositions under vacuum (evaporation, sputtering) reproduce or even amplify the irregularities of the initial surface. Then, to obtain a smoothed outer surface, it is then necessary to carry out a subsequent surfacing operation of an electroconductive material, for example via a mechanical (polishing type) action.

Also, preferably, for the electroconductive coating according to the invention (even for the fill material too), a liquid route deposition technique is chosen, in particular at least one of the following techniques: by (flat, rotary, etc.) printing, in particular by flexographic printing, by etch printing or else by spray-coating, by dip-coating, by curtain-coating, by flow-coating, by spin-coating, by blade-coating, by wire-bar coating, by coating, by ink-jet printing, or by screen-printing. The deposition may also be obtained by a sol-gel route.

Specifically, the surface tension of a liquid film tends to smooth the surface irregularities.

On top of the strands, the thickness of the electroconductive coating, alone or combined with a subjacent electroconductive layer, may be between 40 and 1000 nm and preferably between 50 and 500 nm.

The electroconductive coating may, for example, comprise or be composed of a transparent conductive oxide (TCO) layer.

It is possible to preferably choose the single oxides of tin $SnO_2$, of zinc ZnO, of indium $In_2O_3$ and also the doped oxides, even mixed binary or ternary oxides, in particular of one or more of the aforementioned elements. In particular, at least one of the following doped or mixed oxides is preferred:
- zinc oxide, doped or alloyed with at least one of the following elements: aluminium, gallium, indium, boron, tin, (for example ZnO:Al, ZnO:Ga, ZnO:In, ZnO:B, ZnSnO);
- indium oxide, doped or alloyed, in particular with zinc (IZO), gallium and zinc (IGZO) or tin (ITO);
- tin oxide doped with fluorine or with antimony ($SnO_2$:F, $SnO_2$:Sb) or alloyed with zinc (SnZnO) optionally doped with antimony;
- titanium oxide doped with niobium ($TiO_2$:Nb).

For the fill material, it is possible to choose other oxides in particular high index oxides and in particular:
- niobium oxide ($Nb_2O_5$);
- zirconium oxide ($ZrO_2$);
- titanium oxide ($TiO_2$);
- alumina ($Al_2O_3$);
- tantalum oxide ($Ta_2O_5$);
- or else nitrides such as $Si_3N_4$, AlN, GaN, optionally doped with Zr, or else the stoichiometric silicon carbide SiC.

The electroconductive coating may, for example, comprise a layer containing metallic nanoparticles or nanoparticles of transparent conductive oxides, as mentioned above, preferably between 10 and 50 nm to better limit and control the roughness of the deposition, the nanoparticles optionally and preferably in a binder.

The fill material may, for example, comprise or even be composed of a sol-gel layer in particular based on single or mixed (non-conductive) metal oxides such as those mentioned above.

However, it is tricky to obtain thick sol-gel layers, in particular having a thickness greater than 200 nm.

The fill material may, for example, comprise or even be composed of a layer containing (nano)particles or (non-conductive) oxides as mentioned above.

The nanoparticles are preferably sized between 10 and 50 nm to better limit and control the roughness of the deposition and to prepare the smoothing via a superjacent electroconductive coating. The (nano)particles are (nano)particles optionally in a binder.

The binder may be organic, for example acrylic, epoxy or polyurethane resins, or may be produced by the sol-gel route (mineral or hybrid organic/inorganic binder etc.).

The nanoparticles may be deposited from a dispersion in a solvent (alcohol, ketone, water, glycol, etc.).

Commercial products based on particle which may be used to form the electroconductive coating are the following products sold by Sumitomo Metal Mining Co. Ltd.:
- X100®, X100®D ITO particles dispersed in a(n) (optional) resin binder and with ketone solvent;
- X500® ITO particles dispersed in an alcohol solvent;
- CKR® gold-coated silver particles in an alcohol solvent;
- CKRF® agglomerated gold and silver particles.

The dispersions alone are not very mechanically resistant due to the absence of binder, between the particles. Therefore, in order to ensure the cohesion of the layer of the coating, it is preferred to mix them into a binder before their deposition (binder spread over the entire thickness of the fill layer).

The binder may be electrically insulating or electroconductive.

The binder may be organic, for example acrylic, epoxy or polyurethane resins.

The binder may be produced via a sol-gel route (mineral, or hybrid organic/inorganic, etc.). The binder may be based on organometallic precursors, preferably of the same chemical nature as the nanoparticles of metal oxides.

The resistivity desired for the coating is adjusted as a function of the formulation.

The electroconductive coating (and/or the fill material) may comprise a mainly inorganic or hybrid organic/inorganic layer, for example a sol-gel layer in particular based on single or mixed conductive and/or metal oxides such as those mentioned above.

Sol-gels have the advantage of withstanding even high heat treatments (for example, dip-coating type operation) and of being resistant to UV exposures.

To fabricate a sol-gel layer for the electroconductive coating, commercially available precursors of transparent conductive oxide are preferably chosen, in particular precursors of organometallic compounds or of salts of these metals.

Thus, as examples of precursors for tin oxide depositions, $SnCl_4$, sodium stannate, $SnCl_2(OAc)_2$ or an Sn(IV) alkoxide such as $Sn(OtBu)_4$ may be chosen. It is also possible to choose any organometallic compound or salt known as being a tin precursor.

For antimony oxide depositions, organometallic compounds and salts, in particular alkoxides of Sb(III) and chlorides such as $SbCl_3$ or $SbCl_5$ may be chosen.

Mixed oxide and/or doped layers are obtained, for example, by mixing the precursors in the appropriate proportions and by using solvents compatibles with said precursors.

For example, an antimony-doped tin oxide layer may be obtained from tin chloride and from antimony chloride in solution in water, in the presence or urea and hydrochloric acid. Another production example consists in using tin tetraisopropoxide as a precursor in a water/alcohol/ethanolamine mixture and adding antimony chloride as a dopant.

An example of the sol-gel fabrication of an ITO layer is given on pages 19 to 25 of the thesis entitled "ÉLABORATION ET CARACTERISATION OF FILMS MINCES D'OXIDE D'INDIUM DOPE A THE ETAIN OBTENUS PAR VOIE SOL-GEL" [Production and characterization of thin films of tin-doped indium oxide obtained by a sol-gel route] by Kaïs DAOUDI, order no. 58-2003, presented and upheld at Lyon on 20 May 2003.

It is also possible to use the product named DX-400® sold by Sumitomo Metal Mining Co. Ltd. This is a paste based on tin and indium alkoxides, on an organic solvent and on a viscosity control agent.

The composite electrode preferably has a limited ITO content for cost reasons. For example, an ITO sol-gel layer based on organometallic precursors has a maximum thickness of 150 nm, or even of 50 nm.

The precursors of the metal oxides of alkoxide type are used, for example, diluted in an organic solvent, for example a volatile alcohol. As volatile alcohols, it is possible to choose linear or branched C1 to C10 or 15 alcohols, in particular, methanol, ethanol, hexanol, isopropanol, or else glycols, in particular ethylene glycol or else volatile esters such as ethyl acetate.

The composition used for depositing the sol-gel layer may advantageously also comprise other constituents, in particular water as a hydrolysis agent, or a stabilizer such as diacetone alcohol, acetylacetone, acetic acid or formamide.

In particular, the precursors of metal salt type are generally used in solution in water. The pH of the water may be adjusted by using acids or bases (for example, hydrochloric acid, acetic acid, ammonium hydroxide, sodium hydroxide) to control the condensation conditions of the precursors. Stabilizers such as diacetone alcohol, acetylacetone, acetic acid or formamide may also be used.

After deposition, a drying step is generally carried out between 20 and 150° C., advantageously at a temperature of the order of 100° C., followed by a heat treatment at a temperature of the order of 450 to 600° C. for a period between a few minutes and a few hours, advantageously at a temperature of the order of 550° C. for a period of the order of 30 min.

The electroconductive coating may comprise or be composed of an essentially polymer layer deposited via a liquid route, optionally capable, where appropriate, of forming a binder for the oxide (nano)particles of a fill layer. For example, it is a layer of one or more conductive polymers from at least one of the following families:

the family of polythiophenes, such as PEDOT (3,4-polyethylenedioxythiopene), PEDOT/PSS that is to say 3,4-polyethylenedioxythiopene blended with polystyrenesulphonate, and other derivatives described in Application US2004253439;

or else poly(acetylene)s, poly(pyrrole)s, poly(aniline)s, poly(fluorene)s, poly(3-alkyl thiophene)s, polytetrathiafulvalenes, polynaphthalenes, poly(p-phenylene sulphide), and poly(para-phenylene vinylene)s.

As polythiophenes, it is possible to choose, for example, the product sold by HC Strack under the name BAYTRON® or else sold by Agfa under the name d'Orgacon®, or d'Orgacon EL-P3040®.

The conductive polymer is part of the electrode and also optionally serves as a hole injection layer.

An electroconductive coating, and/or a fill material having a light transmission greater than or equal to 70% at 550 nm, more preferably still greater than or equal to 80% at 550 nm, or even over the entire visible range, is preferred.

A TCO layer produced from precursors is smoother than a layer produced from (nano)particles.

Preferably, the composite electrode, at the very least, the fill material and/or the electroconductive coating has colorimetric coordinates a* and b* below 5 in absolute value in the CIELAB diagram.

In the present application, the network arrangement may be obtained directly by deposition(s) of electroconductive material(s) in order to reduce the fabrication costs.

Thus, post-structuring operations are avoided, for example dry and/or wet etching operations, which often require lithographic processes (exposure of a resist to radiation and development).

This direct arrangement as a network may be obtained directly by one or more suitable deposition methods, for example using a stamp pad, or else via ink-jet printing (with a suitable nozzle).

The electroconductive network may be obtained moreover directly by electroconductive deposition(s) through a network of openings in a mask on the substrate (permanent mask or mask then removed), or even by electroconductive deposition(s) in an etching network of the substrate formed, for example, by etching through said mask, for example over a depth starting from 10 nm, preferably not beyond 100 nm, in particular of the order of 50 nm. This may favour the anchoring of the strands.

In the case of a glass substrate, it is possible, for example, to use fluorinated plasma etching, in particular under vacuum, for example via $CF_4$ or $CHF_3$. Under an oxygenated atmosphere, it is possible to control the etching rate of the mask, in particular when it is chosen to be organic.

The arrangement of the strands may then be substantially the replica of that of the network of openings in the mask or of the etching network.

Preferably a mask is chosen that is stable without the use of an annealing operation.

It is thus possible to then preferably choose one or more deposition techniques that can be carried out at ambient temperature and/or are simple (in particular simpler than a catalytic deposition that inevitable requires the use of a catalyst) and/or give dense depositions.

It is also possible to choose a non-selective deposition technique, the deposition filling both a fraction of the openings in the mask or in the etching network and also covering the surface of the mask or of the substrate. The mask may then be removed or else the surface may be polished.

It is possible in particular to preferably choose a deposition via a liquid route, in particular by printing, by blade coating with a conductive ink, and/or a vacuum deposition technique such as sputtering, or more preferably still evaporation.

The deposition(s) may optionally be completed by an electrolytic recharge using an electrode made of by Ag, Cu, Au or another high-conductivity metal that can be used.

When the electroconductive network is (partly or entirely) deposited in an etching network of the substrate, in particular glass substrate, in order to etch the substrate via a wet route (for example with an HF solution HF for glass), a sol-gel mask with a suitable network of openings may be chosen.

Advantageously, the electroconductive network, then qualified as self-organized, may be obtained by deposition(s) of electroconductive material(s) in a network of self-generated openings in a mask on the substrate.

The network of self-generated openings may for example be obtained by curing a continuous deposition of a material suitable for this purpose. These may be interstices, or cracks in particular such as those described in document U.S. Pat. No. 7,172,822.

The reduction in the number of technological steps necessary for producing such a self-cracked mask favourably influences production yields and the costs of the desired final product.

The self-generated openings, and therefore the strands, may be irregular, distributed aperiodically or (pseudo)randomly.

In a first embodiment of the invention, the mask, preferably having self-generated openings, is removed before deposition of the electroconductive smoothing coating.

In a first mask-free configuration, the electroconductive coating may at least partially fill the space between the strands, at the very least the upper part between the strands (furthest away from the substrate). Its thickness may in particular be at least one and a half times, or even two times, greater than the height of the strands.

In this configuration, an electroconductive coating deposited, for example, by printing, (in particular by flexographic printing), by spray coating or by dip coating may preferably be chosen, the coating being deposited in one or more passes.

Furthermore, still in an advantageous mask-free configuration, the following characteristics may be provided:
the space between the strands is filled, preferably over its entire height, with a fill material, known as a high-index fill material, having a refractive index greater than or equal to 1.65 at least at 550 nm, preferably over the entire visible range, more preferably still a refractive index between 1.65 and 2 at 550 nm, or even over the entire visible range, preferably the distance B between strands is less than or equal to 50 µm, more preferably still less than or equal to 30 µm;
and the strands are made of a metal with colourless reflection (white metal), preferably silver and aluminium or else platinum, chromium, palladium and nickel.

In fact, a fill material is chosen that has an index at least greater than or equal to the index of the active OLED system (that typically has an optical index of the order of 1.7 to 1.9) minus 0.05. Through the choice of such an index, the extraction of the guided modes of the OLED system and, by bringing the strands close enough together, the diffusion of the radiation extracted over the edges of the strands are favoured. The efficiency of the OLED is then increased.

Moreover, a fill material that is not very absorbent, in particular having an absorption in the visible range of less than $10^{-2}$ cm$^{-1}$ is preferred.

As an inorganic high-index fill material, a deposition based on a metal oxide as already indicated, in particular based on $ZrO_2$, $TiO_2$, $Al_2O_3$ or $Ta_2O_5$ may, for example, be chosen. These oxides may be deposited under vacuum or preferably by a liquid route. They may be sol-gels.

As an example of a high-index fill material of sol-gel type, mention may be made of the hybrid sol-gel layers obtained from metallic precursors complexed by stabilizers. For example, layers obtained from solutions of zirconium propoxide or of titanium butoxide complexed by acetylacetone in an alcohol medium. When it does not undergo a high-temperature heat treatment to lead to the corresponding oxide, such a material is composed of a metal oxyhydroxide complexed by the organic molecules. The organic functional groups may be removed by heat treatment starting from 350° C. to obtain inorganic sol-gel layers.

As a high-index inorganic fill material, a high-index glass frit (lead glass, bismuth glass, etc.) may also be chosen, for example deposited by screen printing or by spray coating.

As high-index polymers, mention may be made of the following polymers: poly(1-naphthyl methacrylate-co-glycidyl methacrylate), with 10 mol % of glycidyl methacrylate, poly(2,4,6-tribromophenyl methacrylate), poly(2,4,6-tribromophenyl methacrylate-co-glycidyl methacrylate) with 10 mol % of glycidyl methacrylate, poly(2,6-dichlorostyrene), poly(2-chlorostyrene), poly(2-vinylthiophene), poly(bis(4-iodophenoxy)phosphazene), poly(N-vinylphthalimide), poly (pentabromobenzyl acrylate), poly(pentabromobenzyl methacrylate), poly(pentabromobenzyl methacrylate-co-glycidyl methacrylate) with 10 mol % of glycidyl methacrylate, poly (pentabromophenyl acrylate-co-glycidyl methacrylate) with 10 mol % of glycidyl methacrylate, poly(pentabromophenyl acrylate-co-glycidyl methacrylate) with 50 mol % of glycidyl methacrylate, poly(pentabromophenyl methacrylate), poly (penta-bromophenyl methacrylate-co-glycidyl methacrylate) with 10 mol % of glycidyl methacrylate, poly(pentabromophenyl methacrylate-co-glycidyl methacrylate) with 50 mol % of glycidyl methacrylate, poly(pentachlorophenyl methacrylate), poly(vinyl phenyl sulphide), poly(vinyl phenyl sulphide-co-glycidyl methacrylate) with 10 mol % of glycidyl methacrylate. These polymers are sold, for example, by Sigma-Aldrich.

Another possibility for obtaining a high-index fill material consists in choosing transparent materials with high-index particles, which are polymeric or else inorganic, as the high-index materials already mentioned. For example particles made of $ZrO_2$, $TiO_2$, $SnO_2$ or $Al_2O_3$ are chosen.

As an inorganic transparent material, a glass fit may be chosen.

As a transparent material of sol-gel type, it is possible to choose the silica produced from tetraetoxysilane (TEOS), sodium, lithium or potassium silicate, or a hybrid, obtained from organosilane-type precursors, the general formula of which is:

$$R2_nSi(OR1)_{4-n}$$

with n being an integer between 0 and 2, R1 an alkyl function of $C_xH_{2x+1}$ type, R2 an organic group comprising, for example, an alkyl, epoxy, acrylate, methacrylate, amine, phenyl or vinyl function. These hybrid compounds may be used as mixtures or alone, in solution in water or in a water/alcohol mixture having a suitable pH.

As transparent polymer materials, it is possible to choose silicones, epoxy resins, polyurethanes PUs, ethylene/vinyl acetate EVA, polyvinyl butyral PVB, polyvinyl acetate PVA, and acrylics.

In one advantageous mask-free conception, the fill material is diffusing, in particular based on diffusing particles.

A diffusing fill material having a haze greater than 5% may be preferred.

The diffusing particles may be dispersed in a binder, in proportions of 1 to 80% by weight of the mixture.

These particles may have an average size that is greater than 50 nm and submicron-sized, preferably between 100 and 500 nm, or even between 100 and 300 nm.

The index of the diffusing particles may advantageously be greater than 1.7 and that of the binder may preferably be less than 1.6, for example silica or a hybrid organosilicon material.

The diffusing particles may be organic, for example made of an aforementioned high-index polymer material. Preferably, these diffusing particles may be mineral, preferably nitrides, carbides or oxides, the oxides being chosen from alumina, zirconia, titanium, cerium or being a mixture of at least two of these oxides.

The binder of the diffusing fill material may preferably be chosen from mainly mineral binders, such as potassium silicates, sodium silicates, lithium silicates, aluminium phosphates, silica, and glass frits.

As a hybrid organic/mineral binder, mention may be made of the organosilane-based binders as described previously for the transparent materials.

The diffusing fill material may be deposited by any layer deposition technique known to a person skilled in the art, in particular by screen printing, by coating of a paint, by dip-coating, by spin-coating, by sputtering, or else by flow-coating.

This diffusing fill layer makes it possible to increase the efficiency of the OLED, in particular for relatively large distances between strands, i.e. from 30 µm and even more so to 100 µm and above.

The diffusing fill material may only partially fill the space, in particular may be in the lower part of the space between the network.

The diffusing fill material is insulating. Its thickness may then be preferably between 20% and 100% of the height of the conductive strands and advantageously between 50% and 100% of the thickness of the strands.

It is possible to choose, as the fill material, a fused glass frit or a sol-gel layer.

Numerous chemical elements may be the basis of the sol-gel fill layer. It may comprise, as an essential constituent material, at least one compound of at least one of the elements: Si, Ti, Zr, Sb, Hf, Ta, Mg, Al, Mn, Sn, Zn, Ce. It may be in particular a single oxide or a mixed oxide of at least one of the aforementioned elements. The fill material may preferably be mainly based on silica, in particular for its adhesion to, and its compatibility with a mineral glass.

The sol precursor of the constituent material of the silica layer may be a silane, in particular a tetraethoxysilane (TEOS) and/or a methyltriethoxy-silane (MTEOS), or a lithium, sodium or potassium silicate.

The silica may be a hybrid obtained by or a compound of general formula $R2_nSi(OR1)_{4-n}$ as already mentioned above.

The preferred fill material may be deposited preferably by screen-printing, dip-coating or spray-coating. The conductive subjacent coating may be deposited preferably by printing, in particular by flexographic printing, by dip-coating or spray-coating.

Moreover, as already indicated, it is possible to retain the mask with a network of self-generated openings and the strands fill, preferably entirely, the openings in the network of the mask, the fill material then corresponding to this mask.

This mask may preferably be surfaceable, especially by mechanical polishing, preferably down to the level of the surface of the strands. The polishing may furthermore make it possible to remove, if necessary, conductive material on the surface of the mask resulting from non-selective deposition of the material for the network conductor.

Thanks to the polishing, it may optionally be chosen to deposit the electroconductive coating by a chemical or physical vapour route.

For example, a sol-gel mask, preferably based on silica, may be chosen, with a thickness possibly exceeding one or more microns.

This may in particular be a sol-gel layer of mineral silica obtained from potassium silicate, lithium silicate or sodium silicate.

It may also be a sol-gel layer of hybrid silica obtained from a concentrated sol of precursors of general formula $R2_nSi(OR1)_{4-n}$ where n is an integer between 0 and 2, R1 is an alkyl function of the $C_xH_{2x+1}$ type, and R2 is an organic group preferably with an alkyl, epoxy, acrylate, methacrylate, amine, phenyl or vinyl functional group.

These hybrid compounds may be used as a mixture or by themselves, in solution in water or in a water/alcohol mixture with an appropriate pH. A mass concentration of precursor between 20 and 60%, preferably between 35 and 55%, will be used. By controlling the concentration and the mask drying conditions it is possible to modulate the B/A ratio.

The electroconductive network may be composite, in particular multilayered.

Furthermore, the electroconductive network may comprise or be composed of a layer based on a metal oxide that is inexpensive and easy to fabricate, for example zinc oxide ZnO, or tin oxide $SnO_2$, or else mixed indium and tin oxide ITO. These metal oxides are, for example, deposited by vacuum deposition, by magnetron sputtering, or by ion-beam sputtering.

The electroconductive network may be based on a pure metal material chosen from silver, aluminium, or even platinum, gold, copper, palladium, chromium or based on said material alloyed or doped with at least one other material: Ag, Au, Pd, Al, Pt, Cu, Zn, Cd, In, Si, Zr, Mo, Ni, Cr, Mg, Mn, Co, Sn.

The electroconductive network may comprise or be composed of a layer made of a mainly metal material (continuous medium) and/or of a layer based on metal particles dispersed in matrix that may or may not be electroconductive, for example an ink filled with conductive, in particular silver, particles such as the product TEC-PA-030® sold by InkTec which may be deposited by blade-coating.

As already seen, the deposition(s), in particular metallic deposition(s), may optionally be completed by an electrolytic recharge using an electrode made of by Ag, Cu, Au or another high-conductivity metal that can be used.

Strands may be multilayers, in particular made of a metal first layer made from the aforementioned materials, in particular silver, aluminium, optionally surmounted by copper, and of an overlayer for corrosion protection (water and/or air), for example metallic, made of nickel, chromium, molybdenum, or mixtures thereof or else TCO oxides for example, having a thickness starting from 10 nm, typically between 20 and 30 nm, and for example up to 200 nm or even 100 nm. For example, the overlayer is deposited by evaporation or sputtering.

Preferably, the composite electrode according to the invention (strands, fill material, electroconductive coating) may be mainly mineral, more preferably still, the substrate is also a glass substrate.

The substrate may be flat or curved, and also rigid, flexible or semi-flexible.

Its main faces may be rectangular, square or even of any other (round, oval, polygonal, etc.) shape. This substrate may be of a large size, for example, having a surface area greater than 0.02 m$^2$ or even 0.5 m$^2$ or 1 m$^2$ and with one lower electrode substantially occupying the surface area (apart from the structuring zones).

The substrate may be substantially transparent, mineral or made of a plastic such as polycarbonate PC or polymethyl methacrylate PMMA or else PET, polyvinyl butyral PVB, polyurethane PU, polytetrafluoroethylene PTFE, etc.

The substrate is preferably a glass substrate, in particular made of soda-lime-silica glass.

The substrate may advantageously be a glass having an absorption coefficient less than 2.5 m$^{-1}$, preferably less than 0.7 m$^{-1}$ at the wavelength of the OLED radiation(s). Soda-lime-silica glasses are, for example, chosen with less than 0.05% Fe III or Fe$_2$O$_3$, in particular the Diamant glass from Saint-Gobain Glass, the Optiwhite glass from Pilkington, the B270 glass from Schott. It is possible to choose all the extra-clear glass compositions described in document WO 04/025334.

The thickness of the substrate, in particular the chosen glass substrate, may be at least 0.35 mm, preferably at least 0.7 mm.

The edges of the panel of the substrate may also be reflective and preferably have a mirror, for optimum recycling of the guided radiation, and the edges form with the main face associated with the OLED system an external angle greater than or equal to 45°, but less than 90°, preferably greater than or equal to 80°, in order to redirect the radiation over a wider extraction area. The panel may thus be bevelled.

Furthermore, the process of fabricating the electrode described in document U.S. Pat. No. 7,172,822 inevitably requires the deposition of a sublayer that can be modified at the cracks in order to allow catalyst grafting for metal post-growth, this sublayer therefore having a functional role in the growth process of the network.

This sublayer may also have one of or the following drawbacks:
  low adhesion to a soda-lime glass substrate;
  instability in a basic medium, frequently used during washing of the substrates;
  instability during high-temperature heat treatments (toughening, annealing, etc.).

Therefore, the composite electrode according to the invention may preferably be directly on the substrate, in particular glass substrate.

Moreover, to facilitate the power supply of the electrodes and/or to form a plurality of illumination zones, the composite electrode according to the invention may be discontinuous, typically forming at least electrode zones insulated from one another, and preferably one or more parallel rows of composite electrode zones. In order to do this, the composite electrode is etched, for example with a laser, and the hollow created is filled with passivation material, for example polyimide.

The substrate bearing the composite electrode as defined previously may also comprise an organic light-emitting system deposited directly on the outer surface.

The invention also relates to an organic light-emitting device incorporating the substrate bearing the composite electrode as defined previously, the composite electrode forming what is known as the lower electrode, closest to the substrate.

The organic light-emitting device may comprise:
  a row of composite (lower) electrode zones;
  at least one discontinuous layer made of organic electroluminescent material(s) in the form of electroluminescent layer zones and arranged on the composite (lower) electrode zones; and
  a discontinuous upper electrode having an electroconductive layer in the form of electrode zones arranged on the electroluminescent layer zones.

Various types of connection are possible:
  a single series connection of all of the electroluminescent zones;
  a combination of series and parallel connections;
  series connections specific to each row.

It is recalled that in a series connection, the current flows from an upper electrode zone to the adjacent lower electrode zone.

For a series connection per row, the electroluminescent layer zones may be offset from the lower electrode zones in the direction of the row and along a given direction and the upper electrode zones may be offset from the electroluminescent zones in the direction of the row and in the same direction.

The distance between the electroluminescent zones of separate rows may be greater than the distance between the zones of a given row, preferably above 100 µm, especially between 100 µm and 250 µm.

Each row is thus independent. If one of the zones in each row is defective, the entire row nevertheless operates. The adjacent rows are intact.

The organic light-emitting device according to the invention may or may not be provided with current leads.

Two continuous or discontinuous current lead bands forming part of a current collector or distributor may be respectively in electrical contact with a peripheral edge of the composite lower electrode, and with a preferably peripheral edge of the upper electrode.

These current lead bands may preferably have a thickness between 0.5 and 10 µm and a width of 0.5 mm, and may be of various forms:
  a metallic monolayer made of one of the following metals: Mo, Al, Cr, Nd or an alloy of metals, such as MoCr, AlNd;
  a metallic multilayer formed from the following metals: Mo, Al, Cr, Nd, such as MoCr/Al/MoCr;
  made of a conductive enamel, for example containing silver and screen-printed;
  made of a conductive material or a material filled with conductive particles and deposited by ink-jet printing; and
  made of a conductive polymer whether doped or not by metals, for example silver.

For the upper electrode, it is possible to use a thin metallic layer called a TCC (Transparent Conductive Coating) for example made of Ag, Al, Pd, Cu, Pd, Pt, In, Mo, Au and typically having a thickness between 5 and 50 nm depending on the desired light transmission/reflection.

The upper electrode may be an electroconductive layer advantageously chosen from metal oxides, especially the following materials: doped zinc oxide, especially aluminium-doped zinc oxide ZnO:Al or gallium-doped zinc oxide ZnO:Ga, or else doped indium oxide, especially tin-doped indium oxide (ITO) or zinc-doped indium oxide (IZO).

More generally, it is possible to use any type of transparent electroconductive layer, for example a layer called a TCO (transparent conductive oxide) layer, for example with a thickness between 20 and 1000 nm.

The OLED device may produce monochromatic, especially blue and/or green and/or red, light or may be adapted so as to produce white light.

To produce white light, several methods are possible: mixing of compounds (red, green, blue emission) in a single layer; stacking on the face of the electrodes of three organic structures (red, green and blue emission) or two organic structures (yellow and blue); series of three adjacent organic structures (red, green, blue emission) on the face of the electrodes, one organic structure in one colour and on the other face of the suitable phosphor layers.

The OLED device may comprise a plurality of adjacent organic light-emitting systems, each emitting white light, or by a series of three, emitting red, green and blue light, the systems being for example connected in series.

Each row may for example emit in a given colour.

The OLED device may form part of a multiple glazing unit, especially a vacuum glazing unit or one with an air layer or layer of another gas. The device may also be monolithic and comprise a monolithic glazing unit in order to be more compact and/or lighter.

The OLED system may be bonded to, or preferably laminated with another flat substrate, called a cover, preferably transparent, such as a glass, using a laminating interlayer, especially an extra-clear interlayer.

The laminated glazing units usually consist of two rigid substrates between which a thermoplastic polymer sheet or superposition of such sheets is placed. The invention also includes what are called "asymmetric" laminated glazing units using in particular a rigid carrier substrate of the glass type and, as a covering substrate, one or more protective polymer sheets.

The invention also includes laminated glazing units having at least one interlayer sheet based on a single-sided or double-sided adhesive polymer of the elastomer type (i.e. one not requiring a lamination operation in the conventional meaning of the term, i.e. lamination requiring heating generally under pressure so as to soften the thermoplastic interlayer sheet and make it adhere).

In this configuration, the means for fastening the cover to the carrier substrate may then be a lamination interlayer, especially a sheet of thermoplastic, for example polyurethane (PU), polyvinyl butyral (PVB) or ethylene/vinyl acetate (EVA), or a thermally curable single-component or multi-component resin (epoxy, PU) or ultraviolet-curable single-component or multi-component resin (epoxy, acrylic resin). Preferably, a sheet has substantially the same dimensions as the cover and the substrate.

The lamination interlayer may prevent the cover from flexing, especially for large devices, for example with an area greater than 0.5 m$^2$.

In particular, EVA offers many advantages:
it contains little or no water by volume;
it does not necessarily require high pressure for processing it.

A thermoplastic lamination interlayer may be preferred to a cover made of cast resin as it is both easier to implement and less expensive and is possibly more impervious.

The interlayer optionally includes an network of electroconductive wires set into its internal surface, facing the upper electrode, and/or an electroconductive layer or electroconductive bands on the internal surface of the cover.

The OLED system may preferably be placed inside the double glazing unit, especially with an inert gas (for example argon) layer.

Furthermore, it may be advantageous to add a coating having a given functionality on the opposite face from the substrate bearing the electrode according to the invention or on an additional substrate. This may be an anti-fogging layer (using a hydrophilic layer), an anti-fouling layer (a photocatalytic coating comprising TiO2, at least partly crystallized in anatase form), or else an anti-reflection multilayer for example of the $Si_3N_4/SiO_2/Si_3N_4/SiO_2$ type, or else a UV filter such as, for example, a layer of titanium oxide ($TiO_2$). It may also be one or more phosphor layers, a mirror layer or at least one scattering light extraction layer.

The invention also relates to the various applications to which these OLED devices may be put, said devices forming one or more luminous surfaces, which are transparent and/or reflecting (mirror function), placed both for outdoor and indoor applications.

The device may form, (alternatively or in combination), an illuminating, decorative, architectural etc. system, or an indicating display panel—for example of the drawing, logo or alphanumeric indication type, especially an emergency exit panel.

The OLED device may be arranged to produce uniform light, especially for homogeneous illumination, or to produce various luminous zones, of the same intensity or of different intensity.

Conversely, differentiated illumination may be sought. The organic light-emitting system (OLED) produces a direct light zone, and another luminous zone is obtained by extraction of the OLED radiation that is guided by total reflection in the thickness of the substrate, which is chosen to be made of glass.

To form this other luminous zone, the extraction zone may be adjacent to the OLED system or on the other side from the substrate. The extraction zone or zones may serve for example to increase the illumination provided by the direct light zone, especially for architectural illumination, or else for indicating the luminous panel. The extraction zone or zones are preferably in the form of one or more, especially uniform, bands of light and these preferably being placed on the periphery of one of the faces. These bands may for example form a highly luminous frame.

Extraction is achieved by at least one of the following means placed in the extraction zone: a diffusing layer, preferably based on mineral particles and preferably with a mineral binder; the substrate made to be diffusing, especially a textured or rough substrate.

The two main faces may each have a direct light zone.

When the electrodes and the organic structure of the OLED system are chosen to be transparent, an illuminating window may in particular be produced. Improvement in illumination of a room is then not achieved to the detriment of light transmission. By also limiting the light reflection, especially on the external side of the illuminating window, it is also possible to control the level of reflection, for example so as to meet the anti-dazzling standards in force for the facades of buildings.

More broadly, the device, especially a partly or entirely transparent device, may be:

intended for buildings, such as exterior luminous glazing, an internal luminous partition or a luminous glazed door (or part of a door), especially a sliding one;

intended for a transport vehicle, such as a luminous roof, a luminous side window (or part of a window), an internal luminous partition of a terrestrial, water-borne or airborne vehicle (car, lorry, train, aeroplane, boat, etc.);

intended for urban or professional furniture, such as a bus shelter panel, a wall of a display counter, a jewellery display or a shop window, a greenhouse wall, or an illuminating tile;

intended for interior furnishings, a shelf or cabinet element, a façade of a cabinet, an illuminating tile, a ceiling, an illuminating refrigerator shelf, an aquarium wall;

intended for the backlighting of electronic equipment, especially a display screen, optionally a double screen, such as a television or computer screen, a touch screen.

For example, it is possible to envisage backlighting for a double-sided screen with various sizes, a small screen preferably being associated with a Fresnel lens to concentrate the light.

To form an illuminating mirror, one of the electrodes may be reflecting, or a mirror may be placed on the opposite face to the OLED system, if preferential lighting on only one side in the direct light zone is desired.

It may also be a mirror. The luminous panel may serve for illuminating a bathroom wall or a kitchen worktop, or maybe a ceiling.

The OLEDs are generally divided into two broad families depending on the organic material used.

If the electroluminescent layers are formed from small molecules, the devices are referred to as SM-OLED (Small-Molecule Organic Light-Emitting Diodes). The organic electroluminescent material of the thin layer consists of evaporated molecules, such as for example those of the complex AlQ$_3$ (tris(8-hydroxyquinoline)aluminium), DPVBi (4,4'-(diphenylvinylene)biphenyl), DMQA (dimethyl quinacridone) or DCM (4-(dicyanomethylene)-2-methyl-6-(4-dimethylaminostyryl)-4H-pyran). The emissive layer may also for example be a layer of 4,4',4''-tri(N-carbazolyl)triphenylamine (TCTA) doped with fac-tris(2-phenylpyridine)iridium [Ir(ppy)3].

In general, the structure of an SM-OLED consists of a stack of an HIL (hole injection layer), an HTL (hole transporting layer), an emissive layer and an ETL (electron transporting layer).

An example of a hole injection layer is copper phthalocyanine (CuPC) and the hole transporting layer may for example be N,N'-bis(naphth-1-yl)-N,N'-bis(phenyl)benzidine (alpha-NPB).

The electron transporting layer may be composed of tris-(8-hydroxyquinoline)aluminium (AlQ$_3$) or bathophenanthroline (BPhen).

The upper layer may be an Mg/Al or LiF/Al layer.

Examples of organic light-emitting stacks are for example described in document U.S. Pat. No. 6,645,645.

If the organic electroluminescent layers are polymers, the devices are referred to as PLEDs (polymer light-emitting diodes).

The organic electroluminescent material of the thin layer consists of CES polymers (PLEDs) such as for example PPV standing for poly(para-phenylenevinylene), PPP (poly(paraphenylene)), DO-PPP (poly(2-decyloxy-1,4-phenylene)), MEH-PPV (poly[2-(2'-ethylhexyloxy)-5-methoxy-1,4-phenylenevinylene]), CN-PPV (poly[2,5-bis(hexyloxy)-1,4-phenylene-(1-cyanovinylene)]) or PDAFs (polydialkylfluorenes), and the polymer layer is also associated with a layer that promotes hole injection (an HIL) consisting for example of PEDT/PSS (poly(3,4-ethylene-dioxythiophene)/poly(4-styrene sulphonate)).

One example of a PLED consists of the following stack:

a layer of poly(2,4-ethylene dioxythiophene) doped with poly(styrene sulphonate) (PEDOT:PSS) with a thickness of 50 nm; and a layer of phenyl poly(p-phenylenevinylene) Ph-PPV with a thickness of 50 nm.

The upper electrode may be a layer of Ca.

The invention also relates to the process of fabricating the composite electrode on the carrier substrate as defined previously comprising, in a first configuration, the following steps:

a first step of direct formation of the network arrangement of the conductor, comprising at least one of the following depositions:

a deposition of the electroconductive material of the network via a stamp pad or via conductive ink-jet printing onto the substrate;

a deposition in an etching network of the substrate, preferably a glass substrate;

a second step comprising a deposition of the electroconductive coating via a liquid route.

Or, in a second configuration, the following steps:

a first step of direct formation of the network arrangement of the conductor, including a deposition of the electroconductive material through one layer on the preferably glass substrate, known as a mask, with openings self-organized as a network, until a fraction of the depth of the openings has been filled;

optionally, before the first step, an etching of the substrate through the openings of the mask, thus partially (or completely) anchoring the network in the substrate;

the optional removal of the mask;

a second step comprising a deposition of the electroconductive coating via a liquid route.

As already indicated, the deposition of the electroconductive material of the network in the mask and/or in the etching network may preferably be carried out by a simple, non-selective deposition, preferably by vacuum deposition, in particular by evaporation, or else by a liquid route, in particular blade-coating with a conductive ink, by dip-coating, or by (flat or rotary) printing. This deposition is optionally completed by an electrolytic recharge using a metal such as gold, silver or copper.

In the second configuration, the process according to the invention comprises a step of formation the mask comprising:

the deposition on the (bare or coated) substrate of a layer known as a masking layer;

the curing (that is to say a drying if the layer is liquid) of the masking layer until the network openings that form said mask are obtained.

The masking layer may advantageously be a solution of stabilized colloidal particles dispersed in a solvent, especially an aqueous solution of colloids based on acrylic copolymers.

It is possible to obtain a two-dimensional network of substantially straight-edged openings forming the mask with a random, aperiodic mesh of openings in at least one direction.

Such a network of openings has substantially more interconnections than the cracked silica sol-gel mask. Via this process according to the invention, a mesh of openings, which may be distributed over the entire surface, is thus formed making it possible to obtain isotropic properties.

The mask thus has a random, aperiodic structure in at least one direction, or even in two (all) directions.

Owing to this particular process, it is possible to obtain, at a lower cost, a mask composed of random (shape and/or size), aperiodic units of suitable characteristic dimensions:

- (average) width of the network A is micron-sized, or even nanoscale, in particular between a few hundreds of nanometers to a few tens of microns, especially between 200 nm and 50 µm;
- (average) size of unit B is millimetric or even submillimetric, especially between 5 to 500 µm, or even 100 to 250 µm;
- B/A ratio is adjustable, in particular, as a function of the nature of the particles, especially between 7 and 20 or even 40;
- difference between the maximum width of the openings and the minimum width of the openings is less than 4, or even less than or equal to 2, in a given region of the mask, or even over the majority or the whole of the surface;
- difference between the maximum mesh (unit) dimension and the minimum mesh dimension is less than 4, or even less than or equal to 2, in a given region of the mask, or even over the majority or even over the whole of the surface;
- the amount of open mesh (non-opening, "blind" interstice) is less than 5%, or even less than or equal to 2%, in a given region of the mask, or even over the majority or the whole of the surface, therefore with a limited or even almost zero network rupture that is optionally reduced and can be suppressed by etching of the network;
- for a given mesh, the majority or even all of the meshes in a given region or over the whole of the surface, the difference between the largest dimension that is characteristic of the mesh and the smallest dimension that is characteristic of the mesh is less than 2, in order to strengthen the isotropy; and
- for the majority or even all of the segments of the network, the edges are constantly spaced, parallel, in particular on a scale of 10 µm (for example, observed with an optical microscope with a magnification of 200).

The width A may be, for example, between 1 and 20 µm, or even between 1 and 10 µm, and B may be between 50 and 200 µm.

This makes it possible to subsequently produce a grid defined by an average strand width substantially identical to the width of the openings and an (average) space between the strands substantially identical to the space between the openings (of a mesh). In particular, the sizes of the strands may preferably be between a few tens of microns to a few hundreds of nanometers. The B/A ratio may be chosen between 7 and 20, or even 30 to 40.

The meshes delimited by the openings are of diverse shapes, typically with three, four or five sides, for example predominantly with four sides, and/or of diverse size, distributed randomly and aperiodically.

For the majority or all of the meshes, the angle between two adjacent sides of one mesh may be between 60° and 110°, especially between 80° and 100°.

In one configuration, a main network is obtained with openings (optionally approximately parallel) and a secondary network of openings (optionally approximately perpendicular to the parallel network), the location and the distance of which are random. The secondary openings have a width, for example, smaller than the main openings.

Drying causes a contraction of the mask layer and friction of the nanoparticles at the surface resulting in a tensile stress in the layer which, via relaxation, forms the openings.

Unlike the silica sol-gel, the solution is naturally stable, with nanoparticles that are already formed, and preferably does not contain (or contains a negligible amount of) a reactive element of polymer precursor type.

Drying results, in one step, in the elimination of the solvent and the formation of the openings.

After drying, clusters of nanoparticles are thus obtained, clusters that are of variable size and are separated by the openings that are themselves of variable size.

In order to obtain the openings throughout the entire depth, it is necessary to both:

- choose particles of limited size (nanoparticles), in order to promote their dispersion, preferably with a characteristic (average) size between 10 and 300 nm, or even 50 and 150 nm; and
- stabilize the particles in the solvent (especially by treatment via surface charges, for example via a surfactant, by control of the pH), to prevent them from agglomerating together, from precipitating and/or from falling due to gravity.

In addition, the concentration of the particles is adjusted, preferably between 5%, or even 10% and 60% by weight, more preferably still between 20% and 40%. The addition of a binder is avoided.

The solvent is preferably water-based, or even entirely aqueous.

In a first embodiment, the colloid solution comprises polymeric nanoparticles (and preferably with a water-based, or even entirely aqueous, solvent). For example, acrylic copolymers, styrenes, polystyrenes, poly(meth)acrylates, polyesters or mixtures thereof are chosen.

In a second embodiment, the solution comprises mineral nanoparticles, preferably of silica, alumina, or iron oxide.

Since the particles have a given glass transition temperature $T_g$, the deposition and drying may be carried out at a temperature below said temperature $T_g$ for better control of the morphology of the grid mask.

The deposition and drying steps of the process may especially be carried out (substantially) at ambient temperature, typically between 20° and 25° C. Annealing is not necessary.

The difference between the given glass transition temperature $T_g$ of the particles and the drying temperature is preferably greater than 10° C., or even 20° C.

The deposition and drying steps of the process may be carried out substantially at atmospheric pressure rather than drying under vacuum, for example.

It is possible to modify the drying parameters (control parameters), especially the degree of moisture and the drying rate, in order to adjust B, A, and/or the B/A ratio.

The higher the moisture is (all, things otherwise being equal), the lower A is.

The higher the temperature is (all things otherwise being equal), the higher B is.

By modifying the control parameters chosen from the friction coefficient between the compacted colloids and the surface of the substrate, the size of the nanoparticles, the evaporation rate, the initial particle concentration, the nature of the solvent and the thickness that is dependent on the deposition technique, it is possible to the B/A ratio.

The edges of the mask are substantially straight, that is to say along a midplane between 80 and 100° relative to the surface, or even between 85° and 95°.

Due to the straight edges, the deposited layer discontinues (no or little deposition along the edges) and it is thus possible to remove the coated mask without damaging the grid network. For reasons of simplicity, directional techniques for deposition of the grid material may be favoured. The deposition may be carried out both through the interstices and over the mask.

It is possible to clean the network openings prior to carrying out the first deposition step, preferably using an atmospheric pressure plasma source.

The surface for the deposition of the colloid-based mask layer is a film-forming surface, in particular a hydrophilic surface if the solvent is aqueous. This is the surface of the substrate: glass, plastic (for example, polycarbonate) or of an optionally functional added sublayer: hydrophilic layer (silica layer, for example on plastic) and/or an alkali-metal barrier layer and/or a layer for promoting the adhesion of the grid material, and/or a (transparent) electroconductive layer.

This sublayer is not necessarily a growth layer for an electrolytic deposition of the grid material.

Between the mask layer there may be several sublayers.

The substrate according to the invention may thus comprise a sublayer (especially a base layer, closest to the substrate) that is continuous and capable of being a barrier to alkali metals.

It protects the grid material from any pollution (pollution which may lead to mechanical defects such as delaminations), in the case of an electroconductive deposition (to form an electrode in particular), and additionally preserves its electrical conductivity.

The base layer is robust, quick and easy to deposit according to various techniques. It can be deposited, for example, by a pyrrolysis technique, especially in the gas phase (technique often denoted by the abbreviation CVD for "chemical vapour deposition"). This technique is advantageous for the invention since suitable adjustments of the deposition parameters make it possible to obtain a very dense layer for a reinforced barrier.

The base layer may optionally be doped with aluminium and/or boron to render its deposition under vacuum more stable. The base layer (a single layer or multilayer, optionally doped) may have a thickness between 10 and 150 nm, more preferably still between 15 and 50 nm.

The base layer may preferably be:
based on silicon oxide, silicon oxycarbide, a layer of general formula SiOC;
based on silicon nitride, silicon oxynitride, silicon oxycarbonitride, a layer of general formula SiNOC, especially SiN, in particular $Si_3N_4$.

Most particularly, a base layer (predominantly) made of doped or undoped silicon nitride $Si_3N_4$ may be preferred. Silicon nitride is deposited very rapidly and forms an excellent barrier to alkali metals.

As a layer that promotes the adhesion of the metal grid material (silver, gold), especially onto glass, it is possible to choose a layer based on NiCr, Ti, Nb, Al, a single or mixed, doped or undoped metal oxide (ITO, etc.), for example, having a thickness less than or equal to 5 nm.

When the substrate is hydrophobic, it is possible to add a hydrophilic layer such as a silica layer.

Still in the second configuration, before the second deposition step, a removal step may be provided, preferably via a liquid route, for example by selective chemical dissolving of the mask (in water, alcohol, acetone or acid or basic solutions), optionally when hot and/or assisted by ultrasounds, until said electroconductive network is revealed.

Again in the second configuration, it is possible, before the second deposition step, to provide a mask removal step, for example by selective chemical dissolution of the mask (in water, alcohol or acid or basic solutions), until said electroconductive network has been revealed.

In the first configuration or the second configuration (after removal of the mask until said electroconductive network has been revealed), a thinner deposition of a fill material may be provided.

This fill material may optionally also be diffusing, high-index, and made of the materials already described, in particular it may be a sol-gel layer.

The deposition may be carried out, for example by printing, by screen-printing, by blade-coating with an ink, by dip-coating or by spray-coating depending on the materials and formulations chosen.

In the first configuration or the second configuration (after removal of the mask until said electroconductive network has been revealed), it is possible, in an alternative, to provide a step of filling the strands and of covering the electroconductive network with a surfaceable fill material, an optional heat treatment, followed by a mechanical polishing step until an electroconductive network and a fill layer of substantially the same height and with a sufficiently smooth surface before said second step are obtained.

This surfaceable fill layer may be screen-printed, for example with the glass frit, or may be a sol-gel layer, preferably one that is transparent, for example a layer of mineral or hybrid silica already described.

The fill layer is insulating; the surfacing must of course enable the surface of the strands to be exposed for electrical contact with the superjacent electroconductive coating.

The heat treatment serves for example to melt the glass frit or, in the case of the sol-gel layer, to remove the solvent and/or densify the layer. Several heat treatments are of course possible.

Thanks to the polishing, the second deposition step may even be a vapour deposition step, in particular by sputtering a simple conductive metal oxide, which is a doped and/or mixed oxide such as those already described.

In the second configuration, and using a retained and polishable mask, such as the hybrid sol-gel mask already described, it is possible to carry out a mechanical polishing step until an electroconductive network and a mask of the same height and with a smooth surface before the second deposition step are obtained.

Again, thanks to the polishing, the second deposition step may even be a vapour deposition step, especially by sputtering of a simple conductive metal oxide, which is a doped and/or mixed oxide, such as those already described.

Preferably the composite electrode, at the very least the electroconductive coating, is resistant to the following OLED manufacturing steps:
resistant to 200° C. for 1 h
resistant to a pH of 13 (cleaning solution)
resistant to a pH between 1.5 and 2 (in particular when depositing PEDOT for the electroconductive coating, before the OLED stack)
delamination resistance (scotch tape test).

The invention will now be described in greater detail by means of non-limiting examples and figures.

For the sake of clarity, it should be mentioned that the various elements of the objects shown are not drawn to scale.

Organic Light-Emitting Devices

EXAMPLE 1

Figure 1:
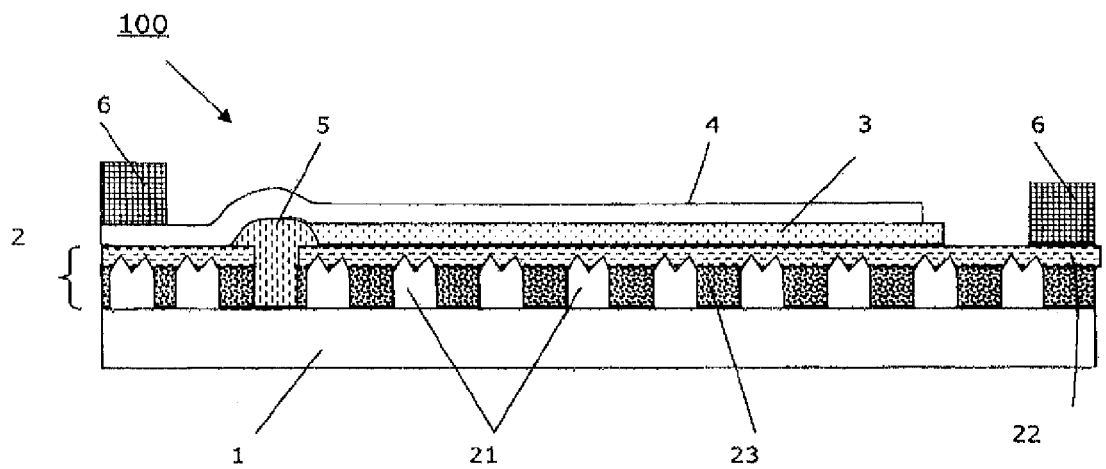
FIG. 1 is a schematic cross-sectional view of a first organic light-emitting device, which comprises a composite lower electrode is according to a first embodiment of the invention.

FIG. 1, which is intentionally highly schematic, shows in cross section an organic light-emitting device 100 (with emission through the substrate or "bottom emission").

This device 100 comprises a flat substrate 1 of soda-lime-silica glass that is clear, for example rectangular, with a thickness of 0.7 mm, with first and second main faces 11, 12.

The first main face 11 comprises:
a composite lower electrode 2, explained in detail later on;
an organic light-emitting system 3, for example an SM-OLED of the following structure:
  an alpha-NPD layer;
  a TCTA+Ir(ppy)$_3$ layer;
  a BPhen layer;
  an LiF layer;
a reflective upper electrode 4, in particular that is metallic, in particular that is based on silver or on aluminium.

More specifically, the composite lower electrode 2 comprises firstly a 1 μm thick, aperiodic network conductor 21, formed from irregular silver-based strands, of average width A of around 3 μm, and spaced apart from one another by an average distance B of around 30 μm, with a B/A ratio of 10.

In this way, through a judicious choice of B/A and of the thickness, the particularly low sheet resistance of this network 21 is around 0.6Ω/□. The light transmission $T_L$ of this network 21 is around 70% and the strands are invisibles to the naked eye.

Optionally, it is possible to deposit a protective overlayer made of nickel or chromium, having a thickness of about 10 nm, onto the metallic strands, in order to thus form composite strands.

A high-index fill layer 23, formed from TiO$_2$ nanoparticles with a size of less than 50 nm, is used between the strands of the network 21. The index is around 1.8. This layer 23 may be deposited with a solvent, which is then evaporated. This layer 23 improves the extraction of the guided modes in the organic layers.

The electroconductive coating 22, made of PEDOT/PSS deposited by a liquid route, has a resistivity ρ1 of the order of $10^{-1}$ Ω·cm, with a thickness of the order of 100 nm, and fills the remaining space and smooths the electrode 2.

Figure 2:
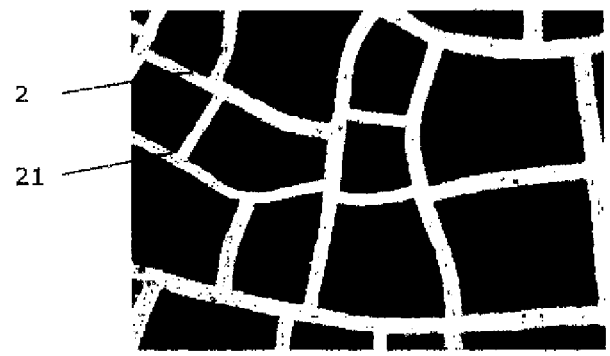
FIG. 2 illustrates a schematic top view of the network of the electrode used in the device from FIG. 1.

The electroconductive network 21 is fabricated by evaporation of silver on a mask provided with a network of self-organized openings. The mask is then removed. The irregular arrangement of the electroconductive network 21 with its strands 210 is shown in FIG. 2.

For the power supply of the electrodes 2, 4, an opening of the composite electrode 2 is made in the vicinity of a longitudinal edge and preferably over its entire length, before the deposition of the organic layers 3. This opening is made, for example, with a laser and is around 150 μm wide. This etched zone is then passivated by means of an insulating resin 5 of acrylic type.

In the electrical junction zones, provided here in the vicinity of the longitudinal edges, it is preferred to add conventional busbars 6, for example by screen-printing of silver on the electrodes 2, 4.

The device 100 produces homogeneous illumination over an area which may be large. If it is desired to create a plurality of luminous zones, at the time of etching for the connection system, other suitable laser etchings are carried out, for example 150 μm wide, and are then passivated.

EXAMPLE 2

Figure 3:
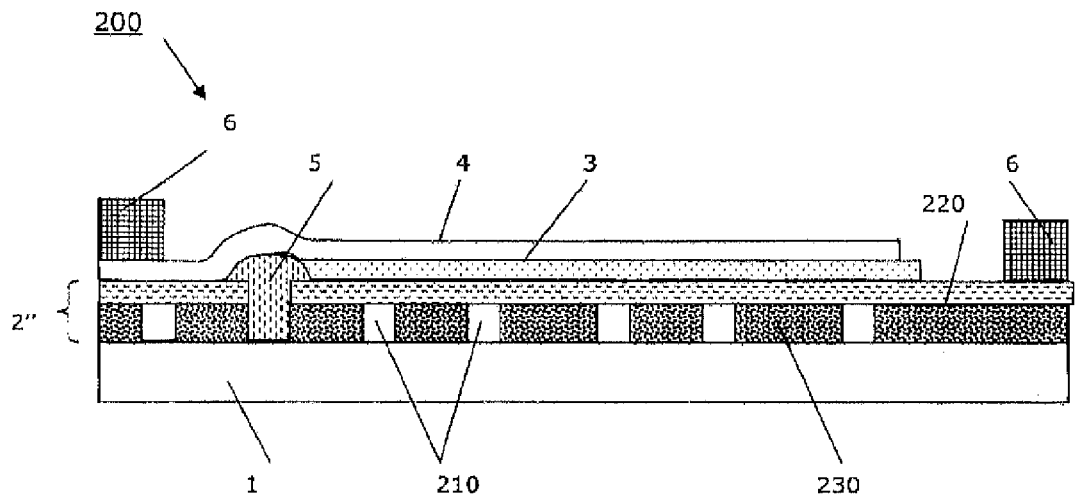
FIG. 3 is a schematic cross-sectional view of a second organic light-emitting device, which comprises a composite lower electrode according to second embodiment of the invention.

FIG. 3 shows a cross-sectional view of an organic light-emitting device 200 which comprises a composite electrode 2". Only the modifications with respect to the device 100 are explained in detail below.

Inserted between the stands of the network 210 is a fill layer 230 made of fused glass frit.

The surface formed by the strands of the network 210 and of the fused glass frit 230 is smoothed by mechanical polishing, for example polishing with alumina, or with cerium oxide, etc. This glass frit may as a variant be a high-index frit.

To fabricate the composite electrode 210, the glass frit is deposited between the strands of the network 210 and beyond, so as to form an overlayer on the strands. After annealing, the surface is then shaved down to the level of the strands.

Alternatively, it is possible to choose, as fill layer, a sol-gel layer, for example a layer of hybrid silica obtained from a sol composed of MTEOS (methyltriethoxysilane). The precursor is hydrolysed in a water/ethanol medium, the water being acidified to pH=2 with hydrochloric acid. Three moles of water and three moles of ethanol are added per mole of MTEOS. The formulation is preferably deposited by dip coating or by spray coating. The deposited formulation is dried at 100° C. and then undergoes a heat treatment at 450° C. for one hour. It may be preferable to choose to deposit the formulation as an overlayer and, after optional drying and annealing, to polish the sol-gel layer, by shaving away the surface until reaching the strands.

This sol-gel layer may be a high-index layer, for example one filled with ZrO$_2$.

Since the fill layer 230 is insulating, the electroconductive coating 220 is chosen to have quite a low resistivity. The electroconductive coating 220 preserves the smoothing and enables the current to be distributed.

Thanks to the polishing, it is possible to choose to deposit the electroconductive coating 220 by vapour deposition. For example, it may be chosen to deposit ITO by sputtering in order to obtain a resistivity ρ1 of the order of $10^{-4}$ Ω·cm, with a thickness no lower than 40 nm. It is also possible to form an ITO sol-gel layer with a resistivity ρ1 of the order of $10^{-2}$ to $10^{-3}$ Ω·cm, with a thickness of around 70 nm.

Alternatively, the electroconductive coating may be of PEDOT/PSS deposited by a liquid route.

In a variant of the organic light-emitting device 400, a polished glass frit is not used since a mask consisting of a network of self-organized openings, typically cracks, is retained, this mask being used to fabricate the network of the electrode. It may be a solid polished monolithic mask, for example a hybrid sol-gel layer. It is preferable to choose a silica layer obtained from a sol composed of TEOS (triethoxysilane) and MTEOS in a molar ratio equal to 1. The precursors are hydrolysed in a water/ethanol medium, the water being acidified to pH=2 with hydrochloric acid. The concentration by weight of precursors is 45%. The formulation is preferably deposited by dip coating or by spray coating. After the formulation has been deposited, it immediately undergoes a high-temperature heat treatment, for example at 450° C. for one hour, in order to generate the cracks.

To fabricate the smooth composite electrode, conductive network material, for example silver, is deposited by a liquid route, for example by blade coating with an ink until a fraction of the height of the mask has been filled. The surface of the mask is then shaved away by polishing until the strands are reached.

EXAMPLE 3

Figure 4:
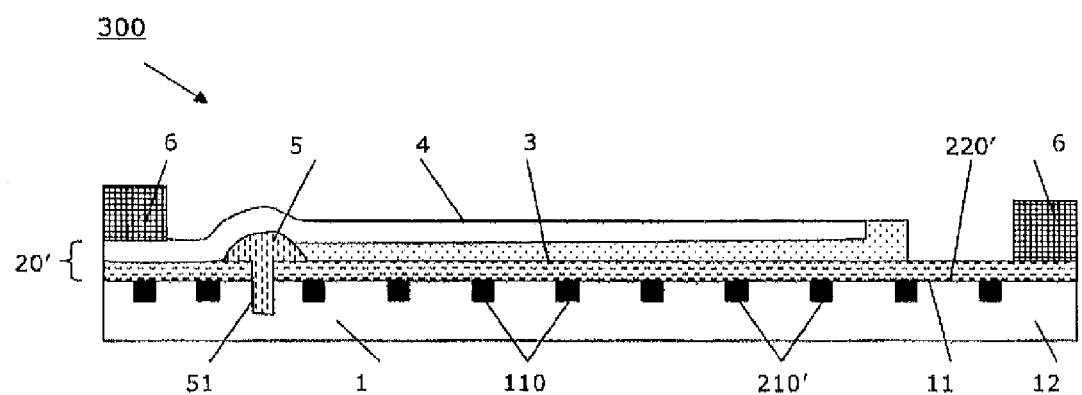
FIG. 4 is a schematic cross-sectional view of a third organic light-emitting device, which comprises a composite lower electrode according to a third embodiment of the invention.

FIG. 4 shows a sectional view of an organic light-emitting device 300 which includes a composite electrode 20'. Only the modifications relative to the device 100 will be detailed below.

The electroconductive network 210' is in an edging network 110 of the glass 1, with a thickness of one micron.

A cracked sol-gel mask on the glass, for example based on a hybrid or non hybrid silica, is used.

The substrate undergoes wet etching with an HF solution.

The material of the network is deposited while keeping the sol-gel mask, the deposition being carried out through the cracks. Preferably, vacuum deposition is chosen, for example deposition of silver by evaporation, or deposition of ITO or IZO by sputtering. It is also possible to choose a liquid route, for example using a doctor blade with a silver ink. The thickness of the deposit may be controlled, preferably so as to fill the etched zones entirely.

If the mask is removed before the network material has been deposited, the glass is then polished so as to remove the electroconductive deposit on its free surface.

The electroconductive coating 220' may or example be PEDOT/PSS deposited by a liquid route with a thickness from 50 nm upwards.

Care is taken to ensure that the longitudinal etching 51 for the connections is deeper than the etching network 110.

In all the examples, the external surface of the coating is such that, starting from an actual profile of the external surface over the average period of the B+A network and by forming a corrected profile by nano scale filtering in order to remove the local micro roughness, what is obtained at every point of the corrected profile is an angle formed by the tangent to the corrected profile with the average plane of the corrected profile of less than or equal to 45°.

Starting from the residual profile formed by the difference between the actual profile and the corrected profile, what is obtained at every point on the corrected profile is a maximum difference in height between the highest point and the lowest point of the residual profile at least less than 50 nm over the average period of the B+A network.

Fabrication of the Composite Electrode

Given below is an example of the fabrication of the composite electrode employing a mask having a network of self-generated openings in a preferred embodiment.

a) Fabrication of the Mask with Self-Generated Openings

Firstly, the mask with self-generated openings is produced. To do this, a simple emulsion of colloidal particles based on an acrylic copolymer, which are stabilized in water, in a concentration by weight of 40%, is deposited by liquid route. The colloidal particles have a characteristic size of 80 to 100 nm and are sold by the company DSM under the brand name Neocryl XK 52.

The so-called masking layer incorporating the colloidal particles is then dried so as to evaporate the solvent. This drying may be carried out by any appropriate method (hot-air draying etc.).

During this drying step, the system undergoes self-arrangement and describes features according to a structure characterized by the average width of the feature, called hereafter A1 and the average distance between the features called hereafter B1. This stabilized mask will consequently be defined by the ratio B1/A1. A stable mask is obtained without recourse to annealing.

The B1/A1 ratio may be modified by for example adapting the coefficient of friction between the compacted colloids and the surface of the substrate, or else the size of the nanoparticles, or also the rate of evaporation, or the initial concentration of particles, or the nature of the solvent, or the thickness, dependant of the technique of deposition.

To illustrate these various options, an experiment plan with two colloid solution concentrations ($C_0$ and $0.5 \times C_0$) and various thicknesses deposited by regulating the rate of rise of the specimen, is given below. The solution was deposited by dip coating. It should be pointed out that the B1/A1 ratio may be changed by changing the concentration. The results are given in the following table:

| Concentration by weight | Rate of rise (cm/min) | B1: distance between the features (μm) | A1: width of the features (μm) | B1/A1 ratio |
|---|---|---|---|---|
| 20% | 5 | 25 | 3 | 8.4 |
| 40% | 10 | 40 | 3.5 | 11.4 |

The colloid solution whilst also deposited with the concentration $C_0=40\%$ using pull films of various thicknesses. These experiments show that it is possible to vary the side of the features A1 and the distance between the features B1 by adjusting the initial thickness of the colloid layer. The results are given in the following table:

| Thickness deposited by the pull film (μm) | % by weight | B1: space between the strands (μm) | A1: width of the strands (μm) | B1/A1 ratio |
|---|---|---|---|---|
| 30 | 40 | 20 | 2 | 10 |
| 120 | 40 | 110 | 10 | 11.1 | b) Cleaning of the Mask

The use of a plasma source as source for cleaning the organic particles located at the bottom of the cracks subsequently makes it possible to improve the adhesion of the serving electroconductive material to the network of the electrode.

To give an exemplary embodiment, cleaning with the aid of an atmospheric-pressure plasma source, with a transferred-arc plasma based on an oxygen/helium mixture, makes it possible both to improve the adhesion of the material deposited at the bottom of the interstices and to widen the interstices. A plasma source of the brand <<ATOMFLOW>> sold by the company Surfx may be used.

c) Fabrication of the Electroconductive Network

The electroconductive network of the composite electrode according to the invention is produced using this mask. To do this, one or more electroconductive materials are deposited through the mask, until a fraction of the interstices is filled.

As metal, silver or aluminium may preferably be chosen. As conducting oxides, ITO, IZO, or IGZO may preferably be chosen.

The average width of the conducting strands A is approximately equal to any one. The average distance between the conducting strands B is approximately equal to B1.

d) Removal of the Mask

To reveal the structure of the network from the mask, a "lift-off" operation is carried out. The colloidal mask is immersed in a solution containing water and acetone (the cleaning solution is chosen according to the nature of the colloidal particles) and then rinsed so as to remove all the parts coated with colloids.

e) Filling and Covering of the Network

The space between the conducting strands is completely filled with a given material, preferably promoting the extraction of the guided modes in the OLED (high-index, diffusing, etc.) layers and being electroconductive, and the network and the filler material are covered with an electroconductive coating, which completes the smoothing and has an electrical role of distributing the current or maintaining a vertical conductivity.

In particular, the space between strands may be filled and smoothed using one and the same slightly electroconductive material, of suitable resistivity, as in Example 1.

It goes without saying that the invention applies in the same manner using light-emitting systems other than those described in the examples and using a plastic substrate.

The invention claimed is:

1. A substrate bearing, on a face thereof, a composite electrode, which comprises:
    an electroconductive network which is a layer formed from strands made of an electroconductive material based on a metal and/or a metal oxide, and having a light transmission of at least 60% at 550 nm, a space between the strands of the network being filled by an electrically insulating fill material that forms a layer separate from said substrate;
    an electroconductive coating covering the electroconductive network and the electrically insulating fill material in between the strands, in electrical connection with the strands, and in contact with the strands, having a thickness greater than or equal to 40 nm, of resistivity $\rho1$ less than $10^5$ $\Omega \cdot cm$ and greater than the resistivity of the network, the coating forming a smoothed outer surface of the electrode;
    the composite electrode having a sheet resistance less than or equal to $10\Omega/\square$,
    wherein the electrically insulating fill material in between the strands includes a high-index material that has a refractive index greater than or equal to 1.65 at 550 nm.

2. The substrate according to claim 1, wherein the B/A ratio between the average distance B between the strands and the average width of the strands A is between 5 and 15, with an average width of the strands A between 100 nm and 30 µm and/or an average distance between the strands B between 5 µm and 300 µm.

3. The substrate according to claim 1, wherein the electroconductive coating comprises a layer, based on nanoparticles made of one of the following materials: Ag, Al, Cu, Au, Pd, Pt, Cr, or wherein the electroconductive coating comprises a sol-gel layer, mainly based on single tin oxide, zinc oxide or indium oxide, optionally doped and/or mixed; and at least one of the following doped or mixed oxides:
    zinc oxide, doped or alloyed with at least one of the following elements: aluminum, gallium, indium, boron, tin;
    indium oxide, doped or alloyed with zinc, gallium and zinc, tin;
    tin oxide doped with fluorine or with antimony or alloyed with zinc optionally doped with antimony;
    titanium oxide doped with niobium.

4. The substrate according to claim 1, wherein the electroconductive coating comprises an essentially polymer layer, or one or more polymers from at least one of the following families: poly(acetylene)s, poly(thiophene)s, poly(pyrrole)s, poly(aniline)s, or poly(fluorene)s, poly(3-alkyl thiophene)s, polytetrathiafulvalenes, polynaphthalenes, poly(p-phenylene sulphide) and poly(para-phenylene vinylene)s.

5. The substrate according to claim 1, wherein the resistivity $\rho1$ is less than or equal to $10^{-1}$ $\Omega \cdot cm$.

6. The substrate according to claim 1, wherein the electrically insulating fill material is diffusing.

7. The substrate according to claim 6, wherein the electrically insulating fill material includes scattering particles and a binder.

8. The substrate according to claim 7, wherein the binder includes an inorganic material.

9. The substrate according to claim 6, wherein said electrically insulating and diffusing fill material only partly fills the space between the strands.

10. The substrate according to claim 9, wherein said electrically insulating and diffusing fill material fills a lower portion, closer to the substrate, of the space between the strands.

11. The substrate according to claim 1, wherein the electroconductive network is at least partially in an etching network of the substrate.

12. The substrate according to claim 1, wherein the electroconductive network comprises a layer based on a pure metallic material chosen from silver, aluminum, copper, palladium, chromium, platinum or gold, or based on said material allied or doped with at least one other material chosen from: Ag, Au, Pd, Al, Pt, Cu, Zn, Cd, In, Si, Zr, Mo, Ni, Cr, Mg, Mn, Co, Sn.

13. The substrate according to claim 1, wherein said substrate is a glass substrate.

14. The substrate according to claim 1, comprising an organic light-emitting system deposited directly on the outer surface of the electrode.

15. An organic light-emitting device incorporating a substrate according to claim 1, the composite electrode forming a lower electrode closest to the substrate.

16. A process for fabricating the composite electrode on the substrate according to claim 1, comprising:
    forming the electroconductive network arrangement, the forming comprising at least one of the following depositions:
        a deposition of the electroconductive material of the network via an stamp pad;
        a deposition of the electroconductive material via conductive ink-jet printing onto the substrate,
        a deposition of the electroconductive material in an etching network of the substrate; and
    depositing the electroconductive coating via a liquid route.

17. The process for fabricating the composite electrode according to claim 16, wherein the deposition of the electroconductive material of the network onto the mask or the etching network comprises a non-selective deposition via evaporation, or a deposition via a liquid route, including by printing, by blade coating with a conductive ink, by dip coating, or by spray coating, the deposition optionally completed by an electrolytic recharge by a metal such as gold, silver, copper.

18. The process for fabricating the composite electrode according to claim 16, wherein before depositing the electroconductive coating, the process comprises:
    filling the space between strands with at least one of the following fill materials: a high-index material or a high-index diffusing material;

where appropriate, removing the mask optionally present until said electroconductive network is revealed, preceding the filling.

19. A process for fabricating the composite electrode according to claim 1, comprising forming the electroconductive network, the forming comprising depositing the electroconductive material of the network through a mask on the substrate with openings self-organized as a network, until a fraction of the depth of the openings has been filled; and depositing the electroconductive coating,
wherein said forming includes
depositing onto the substrate a masking layer;
curing the masking layer until the network openings that form said mask are obtained, wherein the masking layer is a solution of colloidal particles that are stabilized and dispersed in a solvent.

20. The substrate according to claim 1, wherein the strands are made of a metal that is silver or aluminum.

21. The substrate according to claim 1, wherein said space between the strands is filled over its entire height by the high-index material.

22. The substrate according to claim 1, wherein said insulating fill material includes a layer of melted glass frit.

23. The substrate according to claim 1, wherein said light transmission is at least 70% at 550 nm.

24. The substrate according to claim 23, wherein said light transmission is at least 80% at 550 nm.

25. The substrate according to claim 1, wherein said sheet resistance is less than or equal to $5\Omega/\square$.

26. The substrate according to claim 25, wherein said sheet resistance is less than or equal to $1\Omega/\square$.

27. The substrate according to claim 1, wherein said electrically insulating fill material includes different materials.

28. The substrate according to claim 1, wherein said separate layer forming the electrically insulating fill material includes a plurality of layers.

29. The substrate according to claim 1, wherein the refractive index of said high-index material is equal to or greater than a refractive index of an organic light-emitting system deposited over the electroconductive coating less 0.05.

30. The substrate according to claim 1, wherein the average distance B between the strands is greater than the average width of the strands A.

31. The substrate according to claim 30, wherein the average distance B is between 5 μm and 300 μm.

32. The substrate according to claim 30, wherein the average width of the strands A is between 100 nm and 30 μm.

33. The substrate according to claim 1, wherein the electroconductive coating comprises a layer of indium tin oxide.

34. The substrate according to claim 1, wherein the electrically insulating fill material includes a material selected from the group consisting of niobium oxide, zirconium oxide, titanium oxide, aluminum oxide, tantalum oxide, silicon nitride, aluminum nitride, gallium nitride and silicon carbide.

35. The substrate according to claim 1, comprising a barrier layer between the substrate and the electroconductive network.

36. The substrate according to claim 1, wherein the high-index material is made of a melted glass frit.

37. The substrate according to claim 1, wherein said insulating fill material includes a layer of sol-gel material including an element selected from the group consisting of Si, Ti, Zr, Sb, Hf, Ta, Mg, Al, Mn, Sn, Zn, and Ce.

38. A substrate bearing, on a face thereof, a composite electrode, which comprises:
an electroconductive network which is a layer formed from strands made of an electroconductive material based on a metal and/or a metal oxide, and having a light transmission of at least 60% at 550 nm, a space between the strands of the network being filled by an electrically insulating fill material that forms a layer separate from said substrate;
an electroconductive coating covering the electroconductive network and the electrically insulating fill material in between the strands, in electrical connection with the strands, having a thickness greater than or equal to 40 nm, of resistivity ρ1 less than $10^5$ Ω·cm and greater than the resistivity of the network;
the composite electrode having a sheet resistance less than or equal to $10\Omega/\square$,
wherein the electrically insulating fill material in between the strands includes a high-index material that has a refractive index greater than or equal to 1.65 at 550 nm.

39. The substrate according to claim 38, wherein said space between the strands is filled over its entire height by the high-index material.

40. The substrate according to claim 38, wherein said insulating fill material includes a layer of melted glass frit.

* * * * *